United States Patent
Yamada et al.

(10) Patent No.: US 10,164,312 B2
(45) Date of Patent: Dec. 25, 2018

(54) WIRING BOARD, ELECTRONIC APPARATUS, AND MANUFACTURING METHOD OF WIRING BOARD

(71) Applicant: FUJITSU LIMITED, Kawasaki-shi, Kanagawa (JP)

(72) Inventors: Tetsuro Yamada, Kawasaki (JP); Akiko Matsui, Meguro (JP); Mitsuhiko Sugane, Ichikawa (JP); Takahide Mukoyama, Kamakura (JP); Yoshiyuki Hiroshima, Nakano (JP); Kohei Choraku, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 12 days.

(21) Appl. No.: 15/233,216

(22) Filed: Aug. 10, 2016

(65) Prior Publication Data
US 2017/0055343 A1 Feb. 23, 2017

(30) Foreign Application Priority Data

Aug. 20, 2015 (JP) .................................. 2015-163103

(51) Int. Cl.
| | |
|---|---|
| H01P 3/02 | (2006.01) |
| H05K 1/02 | (2006.01) |
| H05K 3/00 | (2006.01) |
| H05K 1/18 | (2006.01) |
| H01P 11/00 | (2006.01) |

(52) U.S. Cl.
CPC ............ *H01P 3/026* (2013.01); *H01P 11/003* (2013.01); *H05K 1/024* (2013.01); *H05K 1/0245* (2013.01); *H05K 1/0298* (2013.01); *H05K 1/181* (2013.01); *H05K 3/0058* (2013.01); *H05K 2201/0723* (2013.01)

(58) Field of Classification Search
CPC .... H05K 1/0245; H05K 1/024; H05K 1/0298; H05K 1/181; H05K 3/0058; H05K 2201/0723; H01P 3/026; H01P 11/003
USPC ............................................................. 333/5
See application file for complete search history.

(56) References Cited

U.S. PATENT DOCUMENTS

2016/0007450 A1* 1/2016 Kasper ................ H05K 3/4682
174/255

FOREIGN PATENT DOCUMENTS

JP 8-293676 11/1996

OTHER PUBLICATIONS

Data Sheet "SDD Materials : G10-FR4", pp. 1, updated on Jun. 8, 2004.*

* cited by examiner

*Primary Examiner* — Benny Lee
*Assistant Examiner* — Hafizur Rahman
(74) *Attorney, Agent, or Firm* — Staas & Halsey LLP

(57) ABSTRACT

A wiring board includes: a first substrate that includes signal wiring; a second substrate that includes a conductor with an area larger than an area of the signal wiring, and projection formed on a face of the conductor and constituted of an insulator with a pattern corresponding to a pattern of the signal wiring, the second substrate being arranged so that the face of the conductor on which the projection is formed faces the signal wiring; and an intermediate layer that is arranged between the signal wiring and the conductor and includes a fibrous member.

20 Claims, 11 Drawing Sheets

WIRING BOARD, ELECTRONIC APPARATUS, AND MANUFACTURING METHOD OF WIRING BOARD

CROSS-REFERENCE TO RELATED APPLICATION

This application is based upon and claims the benefit of priority of the prior Japanese Patent Application No. 2015-163103, filed on Aug. 20, 2015, the entire contents of which are incorporated herein by reference.

FIELD

The embodiments discussed herein are related to a wiring board, an electronic apparatus, and a manufacturing method of the wiring board.

BACKGROUND

Techniques described below are known as techniques related to a multilayer wiring board where a plurality of substrates including wiring is laminated.

For example, in a known multilayer wiring board, over at least one face of an inner-layer circuit board on which inner-layer circuits and resin insulator layers that each have a reverse pattern of the pattern of the inner-layer circuit are formed, another inner-layer circuit board is laminated via a prepreg.

Stripline having a configuration in which signal wiring is sandwiched via an insulator between shield wiring to which a fixed potential, such as a ground potential or a power source potential, is applied and another shield wiring is formed as described below for example.

A plurality of substrates, which each include signal wiring on one face of a core material and each include shield wiring on the other face of the core material, are prepared. After that, in a state where the signal wiring of one of the substrates and the shield wiring of another one of the substrates face each other, a prepreg is laid between these substrates. The prepreg is formed by for example, impregnating a woven fabric-like material that includes glass fiber, such as glass cloth, with thermosetting resin that contains adhesive. The prepreg functions as an intermediate layer that bonds the one substrate and the other substrate together. After that, the thermosetting resin in the prepreg is hardened by being heated while pressed so that the substrates are pushed against each other. Accordingly, the plurality of substrates is laminated.

When the signal wiring is constituted of a pair of differential wiring lines that constitute differential wiring, and when for example, a high-frequency signal with a frequency of 10 GHz or more is transmitted to the signal wiring, below-described issues may occur. That is, according to an already-existing manufacturing method of a wiring board, glass fiber in a prepreg may easily move closer to the signal wiring. The glass fiber may thus be positioned near only one of the pair of signal wiring lines, and influence of the glass fiber on electrical characteristics of the one signal wiring line may increase. That is, a difference in relative permittivity around the signal wiring line may be caused between the signal wiring lines. As a result, differences in delay time and characteristics impedance may be caused between the signal wiring lines, and transmission quality may decrease. Such issues become more serious as the frequency of a signal is higher.

The following is a reference document.

[Document 1] Japanese Laid-open Patent Publication No. 8-293676.

SUMMARY

According to an aspect of the invention, a wiring board includes: a first substrate that includes signal wiring; a second substrate that includes a conductor with an area larger than an area of the signal wiring, and projection formed on a face of the conductor and constituted of an insulator with a pattern corresponding to a pattern of the signal wiring, the second substrate being arranged so that the face of the conductor on which the projection is formed faces the signal wiring; and an intermediate layer that is arranged between the signal wiring and the conductor and includes a fibrous member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
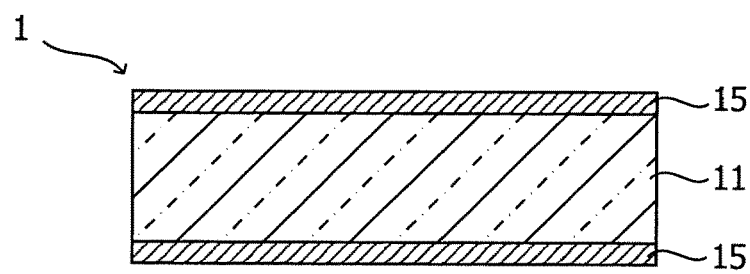
FIG. 1A is a cross-sectional view that illustrates a manufacturing method of a wiring board according to a related art comparison example.
Figure 1B:
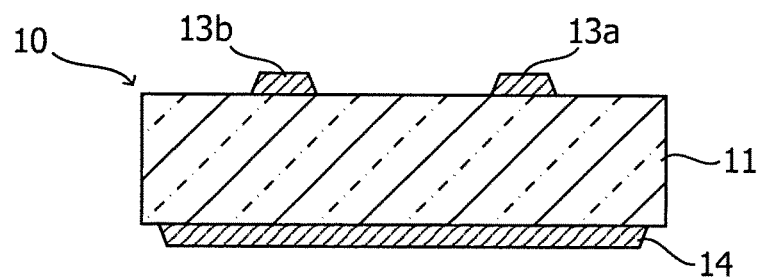
FIG. 1B is a cross-sectional view that illustrates the manufacturing method of the wiring board according to the related art comparison example.

A manufacturing method of a wiring board according to a comparison example is described first. FIGS. 1A to 1C and FIGS. 2A to 2C are cross-sectional views that illustrate the manufacturing method of the wiring board according to the comparison example.

A core material 1 where copper foil 15 is affixed to both faces of a base material 11 is prepared. The base material 11 may be glass epoxy resin obtained by for example, impregnating glass cloth with thermosetting resin. The core material 1 is provided in a state where the thermosetting resin in the base material 11 is hardened in advance (see FIG. 1A).

Subsequently, a pair of signal wiring lines 13a and 13b, which constitute differential wiring, is formed on one of the faces of the base material 11 by performing patterning on the copper foil 15 by etching or the like. Further, shield wiring 14 to which a fixed potential, such as a power source potential or a ground potential, is applied is formed on the other face of the base material 11. Accordingly, a first substrate 10 is formed (see FIG. 1B).

Figure 1C:
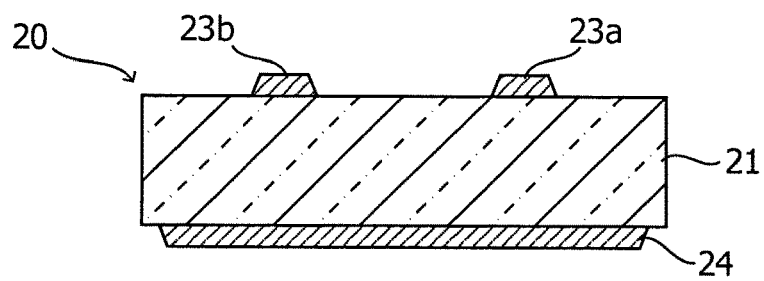
FIG. 1C is a cross-sectional view that illustrates the manufacturing method of the wiring board according to the related art comparison example.

A second substrate 20, which includes a pair of signal wiring lines 23a and 23b on one face of a base material 21 and includes shield wiring 24 on the other face of the base material 21, is formed by performing processes similar to the above-described processes for forming the first substrate 10 (see FIG. 1C).

Figure 2A:
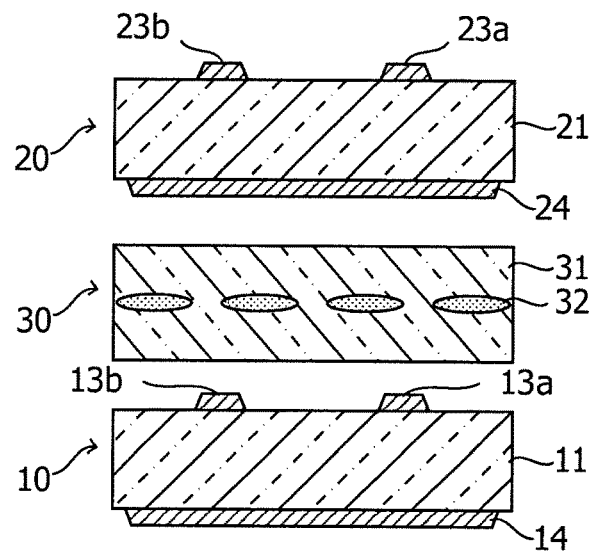
FIG. 2A is a cross-sectional view that illustrates the manufacturing method of the wiring board according to the related art comparison example.
Figure 2B:
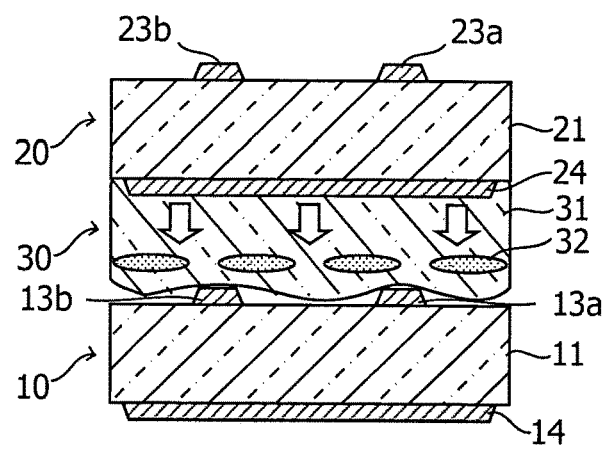
FIG. 2B is a cross-sectional view that illustrates the manufacturing method of the wiring board according to the related art comparison example.

Subsequently, the first substrate 10 and the second substrate 20 are arranged so that the signal wiring lines 13a and 13b and the shield wiring 24 face each other, and a prepreg 30 is arranged between the first substrate 10 and the second substrate 20 (see FIG. 2A). The prepreg 30 is formed so as to include a base material 31 obtained by for example, impregnating a woven fabric-like material that includes a fibrous member like glass fiber 32, such as glass cloth, with thermosetting resin that contains adhesive. The prepreg 30 functions as an intermediate layer that bonds the first substrate 10 and the second substrate 20 together. The prepreg 30 is provided in a state where the thermosetting resin in the base material 31 is unhardened. The base material 31 of the prepreg 30, the base material 11 of the first substrate 10, and the base material 21 of the second substrate 20 may have the same material properties and configurations as one another.

Subsequently, the first substrate 10 and the second substrate 20 are pressed while heated so that the first substrate 10 and the second substrate 20 are pushed against each other. As a result of the heating, the thermosetting resin in the prepreg 30 is softened for a time (see FIG. 2B).

A residual copper rate on the face where the first substrate 10 is in contact with the prepreg 30 is smaller than a residual copper rate on the face where the second substrate 20 is in contact with the prepreg 30. As described above, since the residual copper rate on the face where the first substrate 10 is in contact with the prepreg 30 and the residual copper rate on the face where the second substrate 20 is in contact with the prepreg 30 are different from each other, the pressure that acts on the prepreg 30 varies between the side of the first substrate 10 and the side of the second substrate 20. Accordingly, the thermosetting resin in the prepreg 30 flows to the side of the first substrate 10, where the residual copper rate on the face in contact with the prepreg 30 is smaller when the first substrate 10 and the second substrate 20 are compared with each other. As the thermosetting resin in the prepreg 30 flows to the side of the first substrate 10, the glass fiber 32 is positioned closer to the first substrate 10 (see FIG. 2B).

The residual copper rate on the face where the first substrate 10 is in contact with the prepreg 30 indicates the proportion of the gross area of the signal wiring lines 13a and 13b in the area of the face where the first substrate 10 is in contact with the prepreg 30. The residual copper rate on the face where the second substrate 20 is in contact with the prepreg 30 indicates the proportion of the area of the shield wiring 24 in the area of the face where the second substrate 20 is in contact with the prepreg 30. The respective areas of the face where the first substrate 10 is in contact with the prepreg 30 and the face where the second substrate 20 is in contact with the prepreg 30 are approximately the same as each other. In contrast, the gross area of the signal wiring lines 13a and 13b is smaller than the area of the shield wiring 24. Accordingly, the residual copper rate on the face where the first substrate 10 is in contact with the prepreg 30 is smaller than the residual copper rate on the face where the second substrate 20 is in contact with the prepreg 30.

Figure 2C:
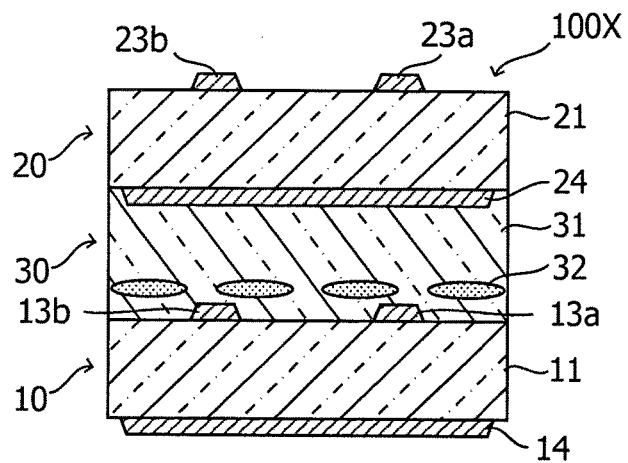
FIG. 2C is a cross-sectional view that illustrates the manufacturing method of the wiring board according to the related art comparison example.

After that, when the thermosetting resin in the prepreg 30 is hardened, a wiring board 100X in which the first substrate 10 and the second substrate 20 are laminated is formed (see FIG. 2C).

Figure 3:
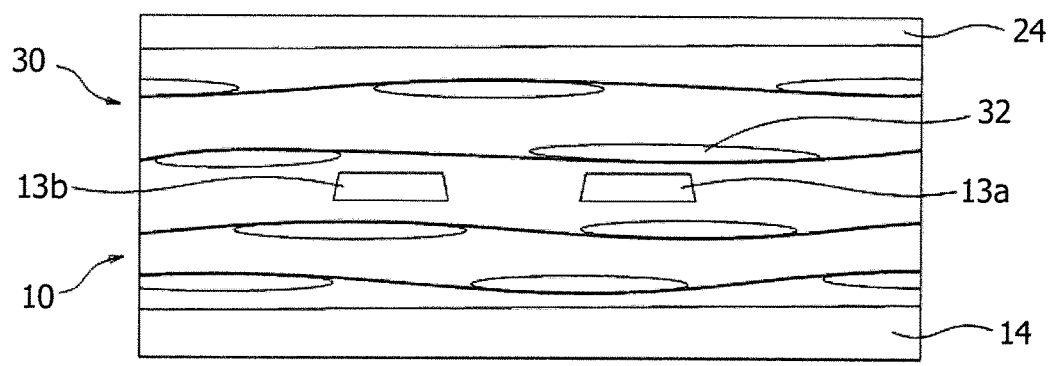
FIG. 3 is a cross-sectional view that illustrates a configuration of the wiring board according to the related art comparison example.

As described above, in the manufacturing method of the wiring board according to the comparison example, since the residual copper rate on the face where the first substrate 10 is in contact with the prepreg 30 and the residual copper rate on the face where the second substrate 20 is in contact with the prepreg 30 are different from each other, the glass fiber 32 is positioned closer to the first substrate 10, where the residual copper rate is smaller. Thus, as illustrated in FIG. 3, the glass fiber 32 may easily be positioned near the signal wiring line 13a only, which is one of the pair of signal wiring lines constituting the differential wiring, and the influence of the glass fiber 32 on the electrical characteristics of the one signal wiring line 13a may increase. That is, a difference in relative permittivity around the signal wiring line may be caused between the signal wiring lines 13a and 13b. As a result, differences in delay time and characteristics impedance may be caused between the signal wiring lines 13a and 13b, and transmission quality may decrease. Such issues become more serious as the frequency of a signal is higher. Accordingly, in a wiring board that constitutes a transmission line of a high-speed signal, it is desired to ensure a distance of a certain length or more between glass fiber in a prepreg and signal wiring. Besides, while it is known that degradation in insulation occurs when glass fiber and a conductor come into contact with each other, the above-described manufacturing method of the wiring board according to the comparison example may bring degradation in insulation, which is caused through contact between the glass fiber 32 and the signal wiring line 13a or 13b.

The present inventors have attempted to produce a wiring board that uses a prepreg with an increased amount of thermosetting resin so as to ensure a distance of 10 μm or more between the glass fiber 32 in the prepreg 30 and the signal wiring lines 13a and 13b. However, no fundamental correction of the unevenness in the position of the glass fiber 32, which is caused by a difference in the residual copper rate, has been achieved and it has failed to ensure the distance of 10 μm or more between the glass fiber 32 in the prepreg 30 and the signal wiring lines 13a and 13b.

To decrease a difference in the residual copper rate between the first substrate 10 and the second substrate 20, forming dummy wiring near the signal wiring lines 13a and 13b is also conceivable. However, such formation of dummy wiring is not preferable because presence of another wiring with a floating or fixed potential near signal wiring that transmits a high-speed signal changes the electrical characteristics of the signal wiring largely.

Examples of embodiments of the present disclosure are described below with reference to the drawings. In the drawings, the same references are given to the same or corresponding constituents or parts. Further, as to the constituents or parts the same as or corresponding to the constituents or parts of the wiring board 100X according to the comparison example described above, the same references as the references used for the constituents of the wiring board 100X are given and repeated descriptions are omitted when appropriate.

[First Embodiment]

Figure 4:
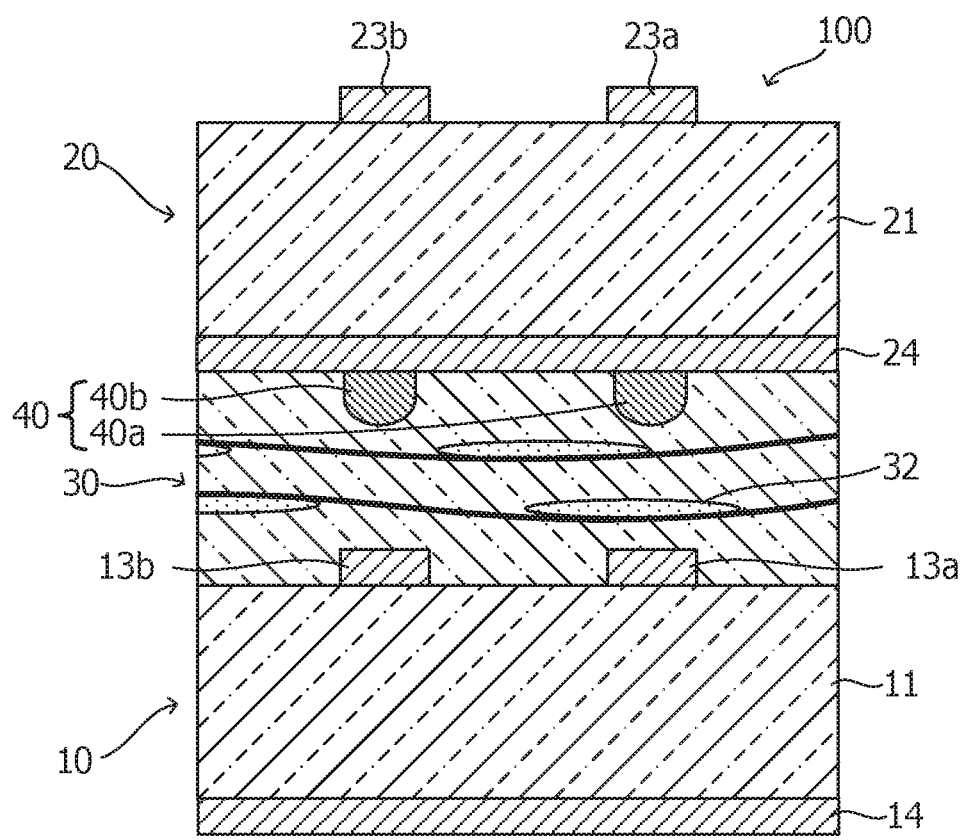
FIG. 4 is a cross-sectional view that illustrates a configuration of a wiring board according to a first embodiment of the present disclosure.
Figure 5:
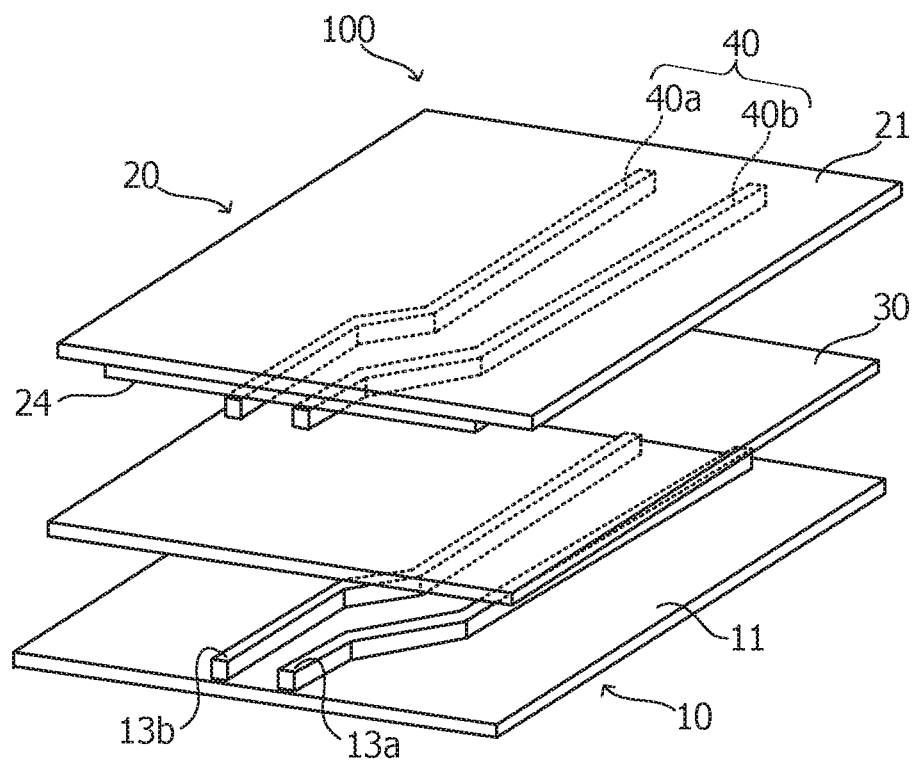
FIG. 5 is a perspective view that separately illustrates constituents of the wiring board according to the first embodiment of the present disclosure.

FIG. 4 is a cross-sectional view that illustrates a configuration of a wiring board 100 according to a first embodiment of the present disclosure, and FIG. 5 is a perspective view that separately illustrates constituents of the wiring board 100.

Similar to the wiring board 100X according to the comparison example, the wiring board 100 according to the first embodiment of the present disclosure includes a first substrate 10 and a second substrate 20 that are laminated while sandwiching a prepreg 30. The first substrate 10 includes a pair of signal wiring lines 13a and 13b constituting differential wiring on one face of a base material 11 and includes shield wiring 14, to which a fixed potential is applied, on the other face of the base material 11. Similarly, the second substrate 20 includes a pair of signal wiring lines 23a and 23b constituting differential wiring on one face of a base material 21 and includes shield wiring 24 on the other side of the base material 21. The first substrate 10 and the second substrate 20 are arranged so that the signal wiring lines 13a and 13b and the shield wiring 24 face each other via the prepreg 30. In the wiring board 100, stripline where the signal wiring lines 13a and 13b are sandwiched between the shield wiring 14 and the shield wiring 24 is formed. The gross area of the signal wiring lines 13a and 13b is smaller than the area of the shield wiring 24. That is, the residual copper rate on the face where the first substrate 10 is in contact with the prepreg 30 is smaller than the residual copper rate on the face where the second substrate 20 is in contact with the prepreg 30. The prepreg 30 is formed so as to include a base material 31 obtained by for example, impregnating a woven fabric-like material that includes glass fiber 32, such as glass cloth, with thermosetting resin that contains adhesive.

On the shield wiring 24, the projection 40, which is constituted of an insulator and includes a pair of linear parts 40a and 40b with approximately the same pattern as the pattern of the signal wiring lines 13a and 13b, is formed. That is, the pair of linear parts 40a and 40b that constitute the projection 40 extends along the signal wiring lines 13a and 13b and projects from the surface of the shield wiring 24. The linear parts 40a and 40b are each arranged in positions that correspond to the positions of the signal wiring lines 13a and 13b in a direction of the face where the shield wiring 24 extends when the first substrate 10 and the second substrate 20 are laminated. That is, the linear parts 40a and 40b are positioned directly above the signal wiring lines 13a and 13b, respectively. The linear parts 40a and 40b are each constituted of an insulator, such as resin.

When the projection 40 (the linear parts 40a and 40b) with a pattern corresponding to the pattern of the signal wiring lines 13a and 13b is formed on the shield wiring 24, the residual copper rate on the face where the second substrate 20 is in contact with the prepreg 30, which is a pseudo residual copper rate, may be approximately equal to the residual copper rate on the face where the first substrate 10 is in contact with the prepreg 30. Accordingly, it may be suppressed that the glass fiber 32 and the signal wiring lines 13a and 13b come close to each other because of the difference in the residual copper rate between the first substrate 10 and the second substrate 20.

A manufacturing method of the wiring board 100 according to the first embodiment of the present disclosure is described below. FIGS. 6A to 6D and FIGS. 7A to 7C are cross-sectional views that illustrate the manufacturing method of the wiring board 100 according to the first embodiment of the present disclosure.

The core material 1 where the copper foil 15 is affixed to both of the faces of the base material 11 is prepared. The base material 11 may be glass epoxy resin obtained by for example, impregnating glass cloth with thermosetting resin. The core material 1 is provided in a state where the thermosetting resin in the base material 11 is hardened in advance (see FIG. 6A).

Subsequently, the pair of signal wiring lines 13a and 13b constituting the differential wiring is formed on one of the faces of the base material 11 by performing patterning on the copper foil 15 by etching or the like. Further, the shield wiring 14 to which a fixed potential, such as a power source potential or a ground potential, is applied is formed on the other face of the base material 11. Accordingly, the first substrate 10 is formed (see FIG. 6B).

Figure 6A:
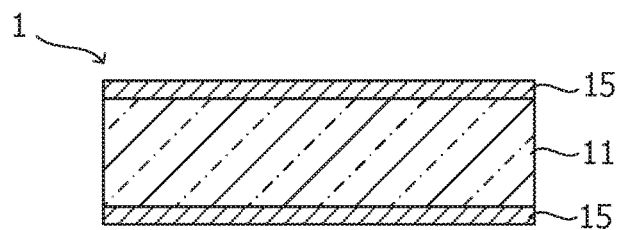
FIG. 6A is a cross-sectional view that illustrates the manufacturing method of the wiring board according to the first embodiment of the present disclosure.
Figure 6B:
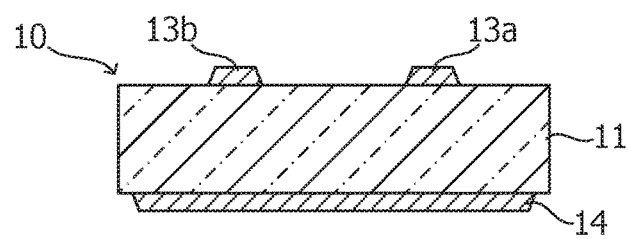
FIG. 6B is a cross-sectional view that illustrates the manufacturing method of the wiring board according to the first embodiment of the present disclosure.
Figure 6C:
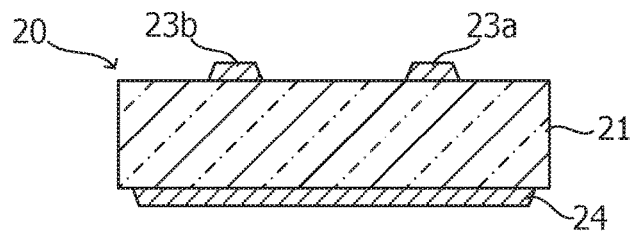
FIG. 6C is a cross-sectional view that illustrates the manufacturing method of the wiring board according to the first embodiment of the present disclosure.
Figure 6D:
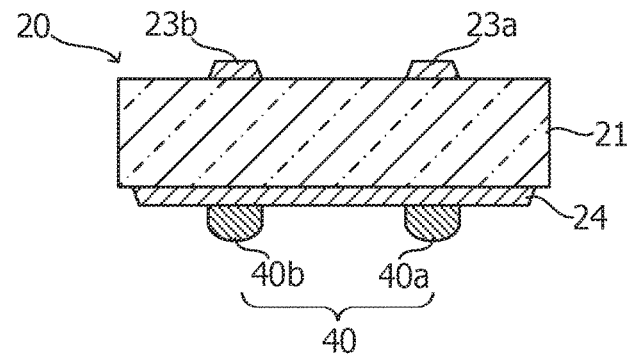
FIG. 6D is a cross-sectional view that illustrates the manufacturing method of the wiring board according to the first embodiment of the present disclosure.

The second substrate 20, which includes the pair of signal wiring lines 23a and 23b on one of the faces of the base material 21 and includes the shield wiring 24 on the other face of the base material 21, is formed by performing processes similar to the above-described processes for forming the first substrate 10 (see FIG. 6C).

Subsequently, the projection 40, which includes the pair of linear parts 40a and 40b with the same pattern as the pattern of the signal wiring lines 13a and 13b of the first substrate 10, is formed on the shield wiring 24 of the second substrate 20. When the first substrate 10 and the second substrate 20 are laminated, the linear parts 40a and 40b are arranged in the positions that correspond to the positions of the signal wiring lines 13a and 13b in the direction of the face where the shield wiring 24 extends (see FIG. 6D). An insulator, such as resin, may be preferably used as a material of the projection 40. The projection 40 may be formed on the shield wiring 24 by a known method, such as a coating method or a transfer method.

Subsequently, the first substrate 10 and the second substrate 20 are arranged so that the signal wiring lines 13a and 13b and the shield wiring 24 face each other, and the prepreg 30 is arranged between the first substrate 10 and the second substrate 20. The linear parts 40a and 40b that constitute the projection 40 are positioned directly above the signal wiring lines 13a and 13b, respectively (see FIG. 7A). The prepreg 30 is formed so as to include the base material 31 obtained by for example, impregnating a woven fabric-like material that includes the glass fiber 32, such as glass cloth, with thermosetting resin that contains adhesive. The prepreg 30 functions as an intermediate layer that bonds the first substrate 10 and the second substrate 20 together. The prepreg 30 is provided in a state where the thermosetting resin that forms the base material 31 is unhardened. The base material 31 of the prepreg 30, the base material 11 of the first substrate 10, and the base material 21 of the second substrate 20 may have the same material properties and configurations as one another.

Subsequently, the first substrate 10 and the second substrate 20 are pressed while heated so that the first substrate 10 and the second substrate 20 are pushed against each other. As a result of the heating, the thermosetting resin in the prepreg 30 is softened for a time. When the projection 40 that includes the linear parts 40a and 40b with approximately the same pattern as the pattern of the signal wiring lines 13a and 13b is formed on the shield wiring 24, the residual copper rate on the face where the second substrate 20 is in contact with the prepreg 30, which is a pseudo residual copper rate, may be approximately equal to the residual copper rate on the face where the first substrate 10 is in contact with the prepreg 30. Accordingly, the pressure that acts on the prepreg 30 may be equalized on the side of the first substrate 10 and the side of the second substrate 20, and the flow of the thermosetting resin in the prepreg 30 may be equalized. That is, the flow of the thermosetting resin in the prepreg 30 to the side of the signal wiring lines 13a and 13b may be suppressed. As a result, it may be suppressed that the glass fiber 32 is positioned closer to the signal wiring lines 13a and 13b (see FIG. 7B).

Figure 7A:
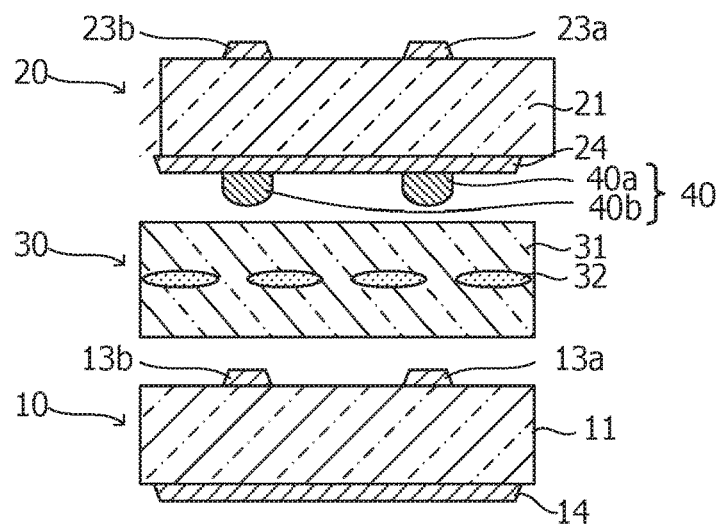
FIG. 7A is a cross-sectional view that illustrates the manufacturing method of the wiring board according to the first embodiment of the present disclosure.
Figure 7B:
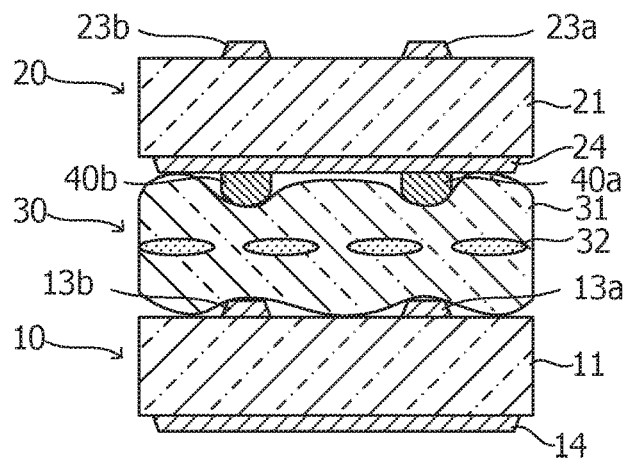
FIG. 7B is a cross-sectional view that illustrates the manufacturing method of the wiring board according to the first embodiment of the present disclosure.
Figure 7C:
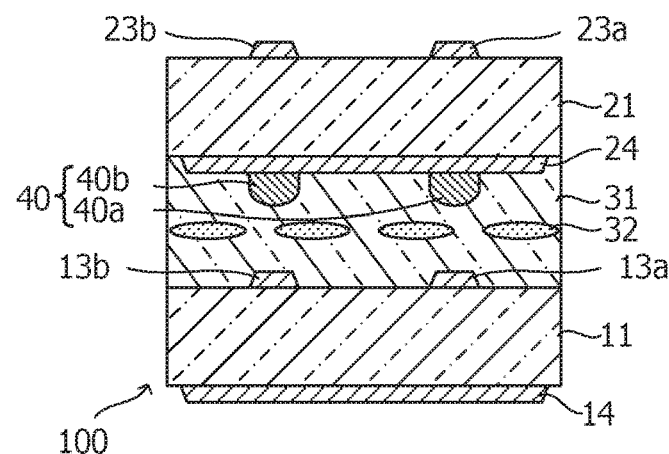
FIG. 7C is a cross-sectional view that illustrates the manufacturing method of the wiring board according to the first embodiment of the present disclosure.

After that, when the thermosetting resin that forms the prepreg 30 is hardened, the wiring board 100 in which the first substrate 10 and the second substrate 20 are laminated is formed (see FIG. 7C).

As described above, in the wiring board 100 according to the first embodiment of the present disclosure, the projection 40 with a pattern that corresponds to the pattern of the signal wiring lines 13a and 13b is formed on the shield wiring 24.

Thus, it may be suppressed that the signal wiring lines 13a and 13b and the glass fiber 32 in the prepreg 30 come close to each other. That is, a distance equal to or more than a certain length may be ensured between the signal wiring lines 13a and 13b and the glass fiber 32. Accordingly, the influence of the glass fiber 32 on the electrical characteristics of the signal wiring lines 13a and 13b may be reduced. Consequently, the relative permittivities around the signal wiring line 13a and the signal wiring line 13b are approximately the same as each other and thus, differences in delay time and characteristics impedance between the signal wiring lines may be suppressed and favorable transmission quality may be ensured. In addition, degradation in insulation caused when the glass fiber 32 and the signal wiring lines 13a and 13b come into contact with each other may be avoided.

It is also conceivable to cause the pseudo residual copper rate on the side of the first substrate 10 to be closer to the residual copper rate on the side of the second substrate 20 by forming projection constituted of an insulator near the signal wiring lines 13a and 13b of the first substrate 10. However, in this case, the influence that the signal wiring lines 13a and 13b receive from the insulator that constitutes the projection may increase and the transmission quality may decrease. Since in the wiring board 100 according to the present embodiment, the projection 40 is formed on the face of the shield wiring 24 of the second substrate 20 that faces the signal wiring lines 13a and 13b via the prepreg 30, the influence of the projection 40 on the electrical characteristics of the signal wiring lines 13a and 13b may be reduced.

[Second Embodiment]

Figure 8:
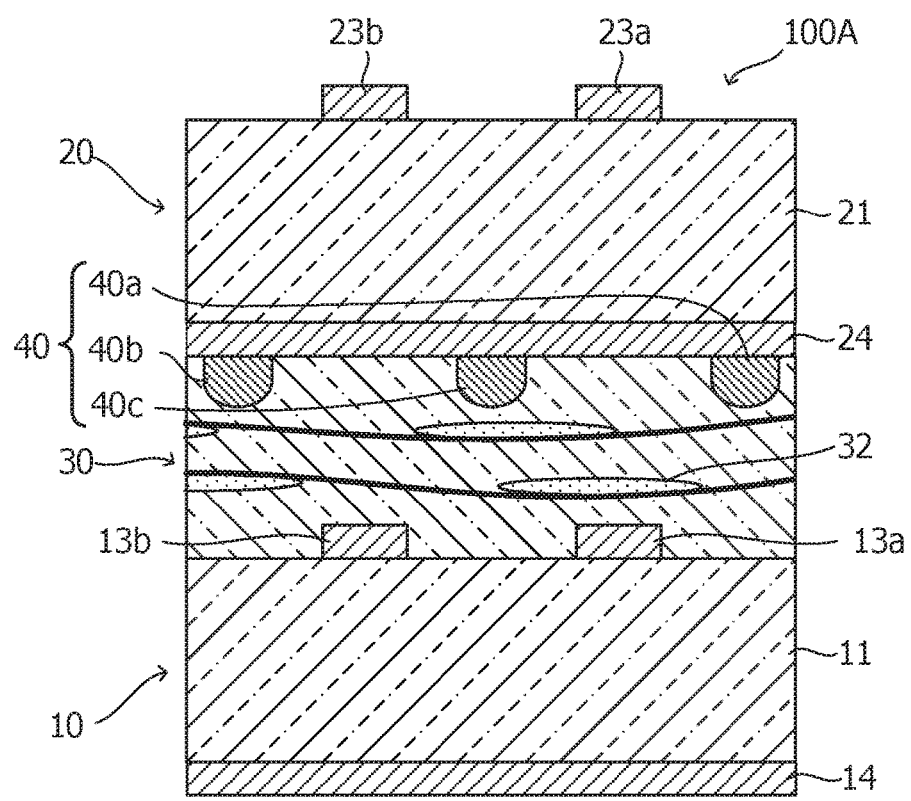
FIG. 8 is a cross-sectional view that illustrates a configuration of a wiring board according to a second embodiment of the present disclosure.

FIG. 8 is a cross-sectional view that illustrates a configuration of a wiring board 100A according to a second embodiment of the present disclosure. The wiring board 100A differs from the wiring board 100 according to the first embodiment in the configuration and position of projection 40.

That is, in the wiring board 100 according to the first embodiment, the projection 40 includes the pair of linear parts 40a and 40b that has approximately the same pattern as the pattern of the signal wiring lines 13a and 13b and is positioned directly above the signal wiring lines 13a and 13b. In contrast, when a first substrate 10 and a second substrate 20 are laminated, the projection 40 according to the second embodiment includes linear parts 40a, 40b, and 40c arranged in positions shifted from the positions directly above a pair of signal wiring lines 13a and 13b in a direction of the face where shield wiring 24 extends. That is, as illustrated in FIG. 8, the projection 40 includes the linear parts 40a and 40b, which are positioned outside the signal wiring lines 13a and 13b and extend along the signal wiring lines 13a and 13b, and includes the linear part 40c, which is positioned between the signal wiring lines 13a and 13b and extends along the signal wiring lines 13a and 13b.

A manufacturing method of the wiring board 100A according to the second embodiment of the present disclosure is described below. FIGS. 9A to 9D and FIGS. 10A to 10C are cross-sectional views that illustrate the manufacturing method of the wiring board 100A according to the second embodiment of the present disclosure.

A core material 1 where copper foil 15 is affixed to both faces of a base material 11 is prepared. The base material 11 may be glass epoxy resin obtained by for example, impregnating glass cloth with thermosetting resin. The core material 1 is provided in a state where the thermosetting resin in the base material 11 is hardened in advance (see FIG. 9A).

Subsequently, the pair of signal wiring lines 13a and 13b, which constitute differential wiring, is formed on one face of the base material 11 by performing patterning on the copper foil 15 by etching or the like. Further, shield wiring 14 to which a fixed potential, such as a power source potential or a ground potential, is applied is formed on the other face of the base material 11. Accordingly, the first substrate 10 is formed (see FIG. 9B).

Figure 9A:
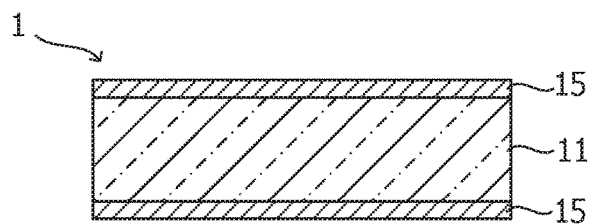
FIG. 9A is a cross-sectional view that illustrates the manufacturing method of the wiring board according to the second embodiment of the present disclosure.
Figure 9B:
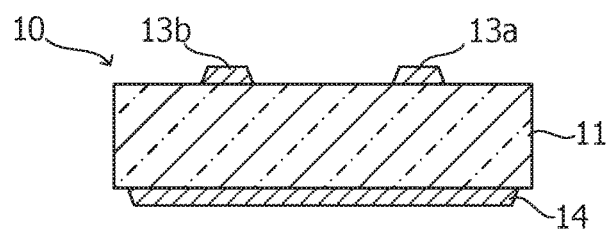
FIG. 9B is a cross-sectional view that illustrates the manufacturing method of the wiring board according to the second embodiment of the present disclosure.
Figure 9C:
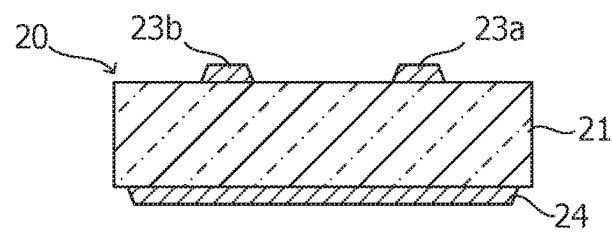
FIG. 9C is a cross-sectional view that illustrates the manufacturing method of the wiring board according to the second embodiment of the present disclosure.
Figure 9D:
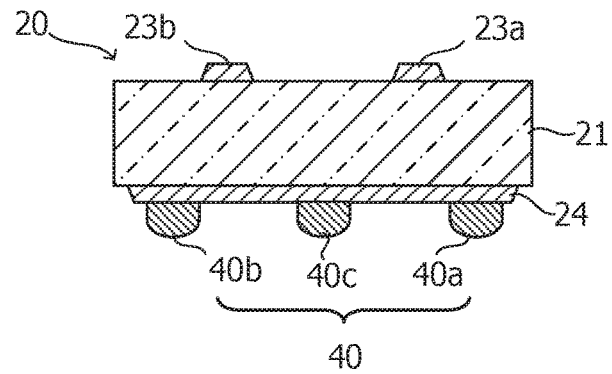
FIG. 9D is a cross-sectional view that illustrates the manufacturing method of the wiring board according to the second embodiment of the present disclosure.

The second substrate 20, which includes a pair of signal wiring lines 23a and 23b on one face of a base material 21 and includes the shield wiring 24 on the other face of the base material 21, is formed by performing processes similar to the above-described processes for forming the first substrate 10 (see FIG. 9C).

Subsequently, the projection 40 that includes the linear parts 40a, 40b, and 40c with a pattern extending along the signal wiring lines 13a and 13b is formed on shield wiring 24 of the second substrate 20. When the first substrate 10 and the second substrate 20 are laminated, the linear parts 40a, 40b, and 40c are arranged in positions that do not overlap the positions directly above the signal wiring lines 13a and 13b in the direction of the face where the shield wiring 24 extends. That is, the linear parts 40a and 40b are arranged so as to be positioned outside the signal wiring lines 13a and 13b, and the linear part 40c is arranged so as to be positioned between the signal wiring lines 13a and 13b (see FIG. 9D). An insulator, such as resin, may be preferably used as a material of the projection 40. The projection 40 may be formed on the shield wiring 24 by a known method, such as a coating method or a transfer method.

Figure 10A:
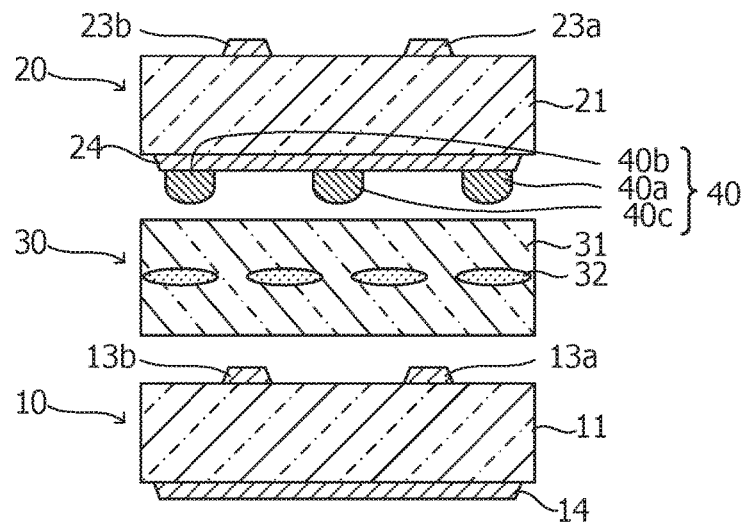
FIG. 10A is a cross-sectional view that illustrates the manufacturing method of the wiring board according to the second embodiment of the present disclosure.
Figure 10B:
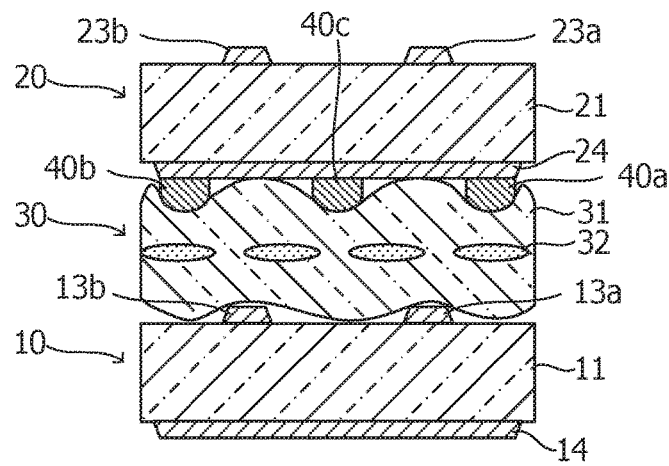
FIG. 10B is a cross-sectional view that illustrates the manufacturing method of the wiring board according to the second embodiment of the present disclosure.

Subsequently, the first substrate 10 and the second substrate 20 are arranged so that the signal wiring lines 13a and 13b and the shield wiring 24 face each other, and the prepreg 30 is arranged between the first substrate 10 and the second substrate 20 (see FIG. 10A).

Subsequently, the first substrate 10 and the second substrate 20 are pressed while heated so that the first substrate 10 and the second substrate 20 are pushed against each other. As a result of the heating, the thermosetting resin in the prepreg 30 is softened for a time. When the projection 40 that includes the linear parts 40a, 40b, and 40c with a pattern corresponding to the pattern of the signal wiring lines 13a and 13b is formed on the shield wiring 24, the residual copper rate on the face where the second substrate 20 is in contact with the prepreg 30, which is a pseudo residual copper rate, may be made close to the residual copper rate on the face where the first substrate 10 is in contact with the prepreg 30. Accordingly, the pressure that acts on the prepreg 30 may be equalized on the side of the first substrate 10 and the side of the second substrate 20, and the flow of the thermosetting resin in the prepreg 30 may be equalized. That is, the flow of the thermosetting resin in the prepreg 30 to the side of the signal wiring lines 13a and 13b may be suppressed. As a result, it may be suppressed that the glass fiber 32 is positioned closer to the signal wiring lines 13a and 13b (see FIG. 10B).

Figure 10C:
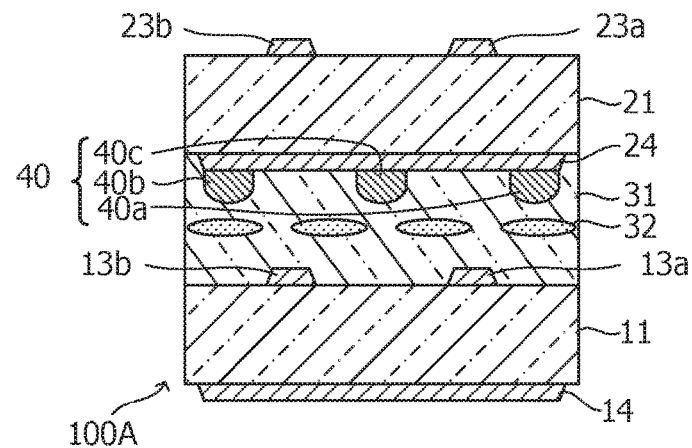
FIG. 10C is a cross-sectional view that illustrates the manufacturing method of the wiring board according to the second embodiment of the present disclosure.

After that, when the thermosetting resin that forms the prepreg 30 is hardened, the wiring board 100A in which the first substrate 10 and the second substrate 20 are laminated is formed (see FIG. 10C).

As described above, in the wiring board 100A according to the second embodiment of the present disclosure, the projection 40 with a pattern that corresponds to the pattern of the signal wiring lines 13a and 13b is formed on the shield wiring 24. Thus, it may be suppressed that the signal wiring lines 13a and 13b and the glass fiber 32 in the prepreg 30 come close to each other. That is, a distance equal to or more than a certain length may be ensured between the signal wiring lines 13a and 13b and the glass fiber 32. Accordingly, influence of the glass fiber 32 on the electrical characteristics of the signal wiring lines 13a and 13b may be reduced. Consequently, the relative permittivities around the signal wiring line 13a and the signal wiring line 13b are approximately the same as each other and thus, differences in delay time and characteristics impedance between the signal wiring lines may be suppressed and favorable transmission quality may be ensured. In addition, degradation in insulation caused when the glass fiber 32 and the signal wiring lines 13a and 13b come into contact with each other may be avoided.

By arranging the linear parts 40a, 40b, and 40c that constitute the projection 40 in positions shifted from the positions directly above the signal wiring lines 13a and 13b, respectively, the influence of the projection 40 on the electrical characteristics of the signal wiring lines 13a and 13b may be decreased. That is, compared to the case where the projection 40 constituted of an insulator is positioned directly above the signal wiring lines 13a and 13b, the influence received from the projection 40 may be decreased in transmitting a signal through the signal wiring lines 13a and 13b.

When the linear parts that constitute the projection 40 are arranged in positions shifted from the positions directly above the signal wiring lines 13a and 13b, respectively, it is preferable to note what is described next. That is, it is preferable to determine the shape and position of each linear part in view of balance between projection and depression, including the pattern of the shield wiring 24, so as to equalize the pressure that acts on the prepreg 30 and the flow of the resin in the prepreg 30 on the side of the first substrate 10 and the side of the second substrate 20.

Although the case where, in each of the wiring board 100 according to the first embodiment and the wiring board 100A according to the second embodiment, the projection 40 is formed as linear patterns extending along the signal wiring lines 13a and 13b is described as an example, the projection 40 is not limited to this example. The projection 40 may be formed so as to include a plurality of segments that are intermittently arranged in series along the signal wiring lines 13a and 13b.

Although the configurations where the wiring board 100 according to the first embodiment and the wiring board 100A according to the second embodiment each include the first substrate 10 and the second substrate 20 are described as examples, one or more substrates may be further laminated over the second substrate 20 via one or more prepregs. In this case, also on shield wiring of a third substrate laminated over the second substrate 20, which is not illustrated, it is preferable to form projection constituted of an insulator with a pattern corresponding to the pattern of the signal wiring lines 23a and 23b formed on the second substrate 20.

Although the case where, in each of the wiring board 100 according to the first embodiment and the wiring board 100A according to the second embodiment, the signal wiring lines 23a and 23b are arranged on the face of the second substrate 20 that is opposite the face where the shield wiring 24 is formed is described as an example, the configuration is not limited to this example. Another shield wiring may be formed on the face of the second substrate 20 that is opposite the face where the shield wiring 24 is formed.

Figure 11A:
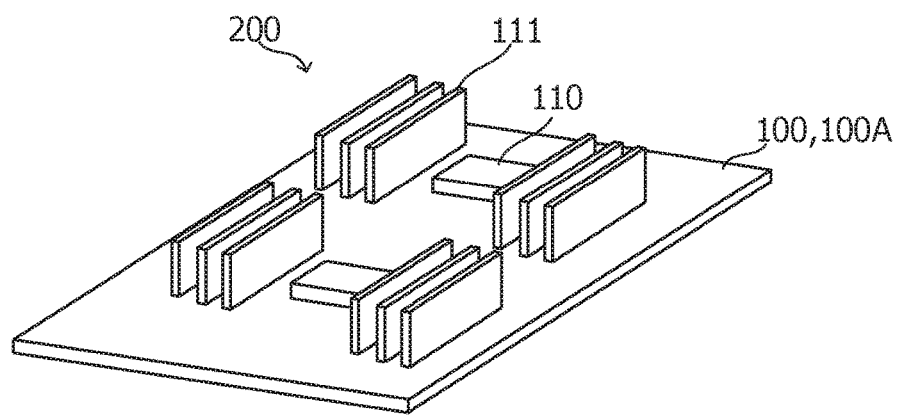
FIG. 11A is a perspective view that illustrates a configuration of an electronic apparatus according to an embodiment of the present disclosure.

FIG. 11A is a perspective view that illustrates a configuration of an electronic apparatus according to an embodiment of the present disclosure, which includes the wiring board 100 according to the first embodiment or the wiring board 100A according to the second embodiment and includes electronic components mounted over the wiring board 100 or 100A.

Figure 11B:
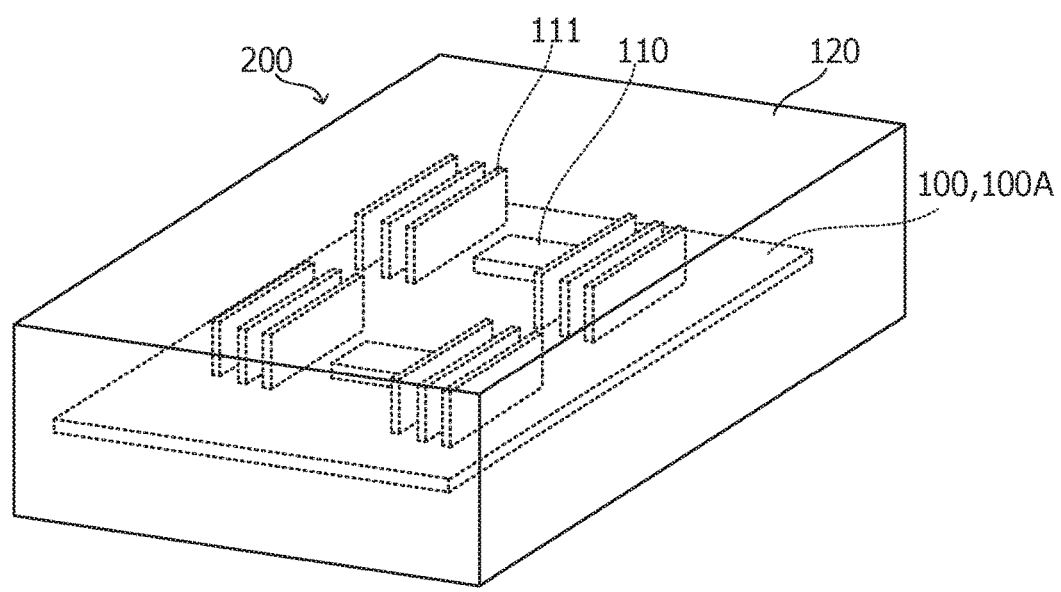
FIG. 11B is a perspective view that illustrates a configuration of the electronic apparatus according to an embodiment of the present disclosure.

FIG. 11A illustrates a server computer 200 in which a plurality of central processing units (CPUs) 110 and a plurality of memory units 111 are mounted over the wiring board 100 or 100A as the electronic components. Input and output signals of the CPUs 110 and the memory units 111 are transmitted through the signal wiring lines 13a and 13b arranged in the wiring board 100 or 100A. The wiring board 100 or 100A over which the CPUs 110 and the memory units 111 are mounted may be accommodated in a casing 120 as illustrated in FIG. 11B.

The wiring boards 100 and 100A according to the first and second embodiments of the present disclosure are not limited to server computers and may be applied to various electronic apparatuses.

The wiring boards 100 and 100A are examples of the wiring board according to the present disclosure. The first substrate 10 is an example of the first substrate according to the present disclosure. The second substrate 20 is an example of the second substrate according to the present disclosure. The signal wiring lines 13a and 13b are examples of the signal wiring lines according to the present disclosure. The shield wiring 24 is an example of the conductor according to the present disclosure. The prepreg 30 is an example of the intermediate layer according to the present disclosure. The glass fiber 32 is an example of the fibrous member according to the present disclosure. The server computer 200 is an example of the electronic apparatus according to the present disclosure. The CPU 110 and the memory unit 111 are examples of the electronic components according to the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
a first substrate that includes signal wiring;
a second substrate that includes
   a conductor with an area larger than an area of the signal wiring, and
   a projection formed on a face of the conductor and constituted of an insulator with a pattern corresponding to a pattern of the signal wiring, the second substrate being arranged so that the face of the conductor on which the projection is formed, faces the signal wiring; and
an intermediate layer that is arranged between the signal wiring and the conductor, and includes a fibrous member.

2. The wiring board according to claim 1, wherein the projection has a linear pattern that extends along the signal wiring.

3. The wiring board according to claim 1, wherein the projection is formed in a position corresponding to a position of the signal wiring.

4. The wiring board according to claim 1, wherein the signal wiring is a pair of differential wiring lines, and the projection includes a pair of linear parts corresponding to the pair of differential wiring lines.

5. The wiring board according to claim 1, wherein the projection is formed in a position shifted from a position of the signal wiring.

6. The wiring board according to claim 1, wherein the intermediate layer includes a prepreg obtained by impregnating glass fiber with thermosetting resin.

7. The wiring board according to claim 1, wherein the conductor is a shield wiring to which a fixed potential is applied.

8. The wiring board according to claim 1, wherein the first substrate includes a conductor formed on a face opposite a face on which the signal wiring is formed and having an area larger than the area of the signal wiring.

9. An electronic apparatus comprising:
a wiring board including
a first substrate that includes signal wiring,
a second substrate that includes
   a conductor with an area larger than an area of the signal wiring, and
   a projection formed on a face of the conductor and constituted of an insulator with a pattern corresponding to a pattern of the signal wiring, the second substrate being arranged so that the face of the conductor on which the projection is formed, faces the signal wiring,
an intermediate layer that is arranged between the signal wiring and the conductor, and includes a fibrous member; and
an electronic component mounted over the wiring board.

10. The electronic apparatus according to claim 9, wherein
the projection has a linear pattern that extends along the signal wiring.

11. The electronic apparatus according to claim 9, wherein
the projection is formed in a position corresponding to a position of the signal wiring.

12. The electronic apparatus according to claim 9, wherein
the signal wiring is a pair of differential wiring lines, and the projection includes a pair of linear parts corresponding to the pair of differential wiring lines.

13. The electronic apparatus according to claim 9, wherein
the projection is formed in a position shifted from a position of the signal wiring.

14. The electronic apparatus according to claim 9, wherein
the intermediate layer includes a prepreg obtained by impregnating glass fiber with thermosetting resin.

15. The electronic apparatus according to claim 9, wherein
the conductor is a shield wiring to which a fixed potential is applied.

16. The electronic apparatus according to claim 9, wherein
the first substrate includes a conductor formed on a face opposite a face on which the signal wiring is formed and having an area larger than the area of the signal wiring.

17. A manufacturing method of a wiring board, the method comprising:

preparing a first substrate that includes signal wiring, and a second substrate that includes a conductor with an area larger than an area of the signal wiring;

forming a projection constituted of an insulator with a pattern corresponding to a pattern of the signal wiring, on a face of the conductor;

arranging the first substrate and the second substrate so that an intermediate layer that includes a fibrous member is sandwiched between the first substrate and the second substrate, and the signal wiring and the conductor face each other; and pressing the first substrate and the second substrate to laminate the first substrate and the second substrate.

18. The manufacturing method according to claim 17, wherein the projection is formed in a position corresponding to a position of the signal wiring.

19. The manufacturing method according to claim 17, wherein the signal wiring is a pair of differential wiring lines, and the projection includes a pair of linear parts corresponding to the pair of differential wiring lines.

20. The manufacturing method according to claim 17, wherein the projection is formed in a position shifted from a position of the signal wiring.

* * * * *